(12) United States Patent
Yoon et al.

(10) Patent No.: US 9,520,160 B2
(45) Date of Patent: Dec. 13, 2016

(54) PRINTED CIRCUIT BOARD AND MEMORY MODULE INCLUDING THE SAME

(71) Applicant: Samsung Electronics Co., Ltd., Suwon-si (KR)

(72) Inventors: Chil-Nam Yoon, Suwon-si (KR); Seon-Ryeong Kang, Seoul (KR); Hui-Chong Shin, Seongnam-Si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 252 days.

(21) Appl. No.: 14/229,483

(22) Filed: Mar. 28, 2014

(65) Prior Publication Data
US 2014/0301125 A1 Oct. 9, 2014

(30) Foreign Application Priority Data
Apr. 5, 2013 (KR) .................. 10-2013-0037621

(51) Int. Cl.
| | |
|---|---|
| H05K 1/11 | (2006.01) |
| H05K 1/14 | (2006.01) |
| G11C 5/06 | (2006.01) |
| G11C 7/10 | (2006.01) |
| G11C 11/4093 | (2006.01) |
| H05K 1/02 | (2006.01) |

(52) U.S. Cl.
CPC .............. G11C 5/06 (2013.01); G11C 7/109 (2013.01); G11C 11/4093 (2013.01); H05K 1/0253 (2013.01); G11C 2207/105 (2013.01); H05K 1/0225 (2013.01); H05K 2201/09327 (2013.01); H05K 2201/10159 (2013.01)

(58) Field of Classification Search
CPC . G11C 11/4093; G11C 2207/105; G11C 5/06; G11C 7/109; H05K 1/0225; H05K 1/0253; H05K 2201/09327; H05K 2201/10159
See application file for complete search history.

(56) References Cited

U.S. PATENT DOCUMENTS

| | | | |
|---|---|---|---|
| 5,457,335 A * | 10/1995 | Kuroda .............. | G11C 16/0408 257/318 |
| 6,125,419 A * | 9/2000 | Umemura ........... | G06F 13/4086 710/110 |
| 6,218,817 B1 | 4/2001 | Chang | |
| 6,762,367 B2 * | 7/2004 | Audet ............... | H01L 23/49822 174/255 |
| 6,828,819 B2 | 12/2004 | Park et al. | |
| 6,947,304 B1 | 9/2005 | Yen | |
| 7,023,719 B1 | 4/2006 | Hung et al. | |
| 7,249,232 B2 | 7/2007 | Halbert et al. | |
| 8,036,011 B2 | 10/2011 | Kim et al. | |

(Continued)

Primary Examiner — Yuriy Semenenko
(74) Attorney, Agent, or Firm — Muir Patent Law, PLLC

(57) ABSTRACT

A memory module includes a plurality of semiconductor memory devices and a circuit board. The circuit board is electrically connected to the plurality of semiconductor memory devices, and a signal line is disposed in the outermost layer of the circuit board. An electrical reference for the signal line is provided in a layer of the circuit board that is not adjacent to the outermost layer. Accordingly, an impedance of the signal line may be increased, and signal integrity of a signal transmitted through the signal line may be improved.

20 Claims, 11 Drawing Sheets

(56) References Cited

U.S. PATENT DOCUMENTS

| | | |
|---|---|---|
| 8,134,239 B2 | 3/2012 | Hiraishi et al. |
| 2006/0137903 A1* | 6/2006 | Sprietsma ............ H05K 1/0216 174/255 |
| 2007/0126462 A1 | 6/2007 | Ryu |
| 2009/0288293 A1 | 11/2009 | Lee et al. |
| 2012/0241202 A1 | 9/2012 | Vasoya |

* cited by examiner

PRINTED CIRCUIT BOARD AND MEMORY MODULE INCLUDING THE SAME

CROSS-REFERENCE TO RELATED APPLICATION

This application claims priority under 35 U.S.C. §119 to Korean Patent Application No. 10-2013-0037621 filed on Apr. 5, 2013, the entire contents of which are incorporated herein by reference in their entirety.

BACKGROUND

Embodiments of the inventions relate to semiconductor memory, memory modules and printed circuit boards.

A memory module with semiconductor memory devices mounted on a printed circuit board is used for various types of electronic apparatuses. The printed circuit board is comprised of a plurality of layers electrically separated by a dielectric material, with the plurality of layers typically containing conductive regions such as signal lines, power planes and ground planes.

The structure of the printed circuit board can have a great effect on signal integrity of a memory system.

SUMMARY

Embodiments of the inventions provide a printed circuit board having high signal line impedance and high signal integrity, as well as a memory module including the printed circuit board. The technical objectives and advantages of the inventive concepts are not limited to the foregoing; other objectives and advantages will become apparent to those of ordinary skill in the art based on the following descriptions.

In accordance with one aspect of the inventive concept, a memory module includes a plurality of semiconductor memory devices, a printed circuit board (PCB) configured to be electrically connected to the plurality of semiconductor memory devices, and use of a reference plane disposed in a layer which is not directly adjacent to a signal line disposed in the outermost layer.

In some embodiments, the circuit board includes a command/address (C/A) signal area that includes a first layer in which signal lines are disposed. A second layer in which signal lines and partial planes are disposed is formed on the upper side of the first layer. A third layer in which power/ground (P/G) planes are disposed is formed on the upper side of the second layer. A fourth layer in which signal lines are disposed is formed on an upper side of the third layer. Vias vertically penetrate from the first layer to the fourth layer, which is the outermost layer, to electrically connect the signal lines between those layers. The partial planes disposed in the second layer operate as reference planes with respect to the signal lines in the fourth layer. The signal lines disposed in the fourth layer may be electrically connected to a plurality of semiconductor memory devices.

In various embodiments the power/ground planes in the third layer further may not be formed in areas of the third layer located directly beneath signal lines in the fourth layer, and these areas in the third layer may include slits. A command/address (C/A) signal may be transmitted to devices through signal lines disposed in the first layer. There may be a layer formed below the first layer that include a power/ground plane that operates as a reference plane with respect to a signal line disposed in the first layer.

In some embodiments, the PCB includes a data (DQ) area that includes signal lines in the first, second layers and fourth layers, and P/G planes in the third layer. In the DQ area vias may extend from the second layer through the outermost fourth layer to the surface of the PCB to connect signal lines in the second layer to memory devices. The signal lines in the second layer may transmit DQ data signals to the memory devices.

In accordance with other aspects of the inventions, embodiments of a memory module may comprise a semiconductor memory device and a circuit board coupled to the semiconductor memory device. The circuit board includes an outer layer disposed below the semiconductor memory device, an inner layer disposed below the outer layer, and an intermediate layer disposed between the inner and outer layers. The outer layer includes a first signal line electrically connected to the semiconductor memory device, the inner layer includes a reference conductive region configured to provide an electrical reference for the first signal line, and the intermediate layer includes intermediate conductive regions.

In various embodiments a circuit board can include a command/address signal area that includes the first signal line, the reference conductive region, the intermediate conductive regions, and a signal layer disposed below the inner layer. The intermediate conductive regions comprise a power/ground plane, the signal layer includes a second signal line electrically connected to the outer layer through a via connecting the outer layer to the signal layer, and the inner layer includes a third signal line. The reference conductive region disposed in the inner layer may comprise a conductive plane configured to provide the electrical reference for the first signal line disposed in the outer layer.

In some embodiments there are no conductive regions disposed in the intermediate layer directly below signals line disposed in the outer layer. There may be slits in the intermediate layer directly below the signal lines.

Some embodiments include one or more command/address signal lines in the signal layer below the inner layer that are electrically connected to one or more semiconductor memory devices.

In still other embodiments a circuit board can include a data area that having a signal layer disposed below the inner layer and a power/ground layer disposed below the signal layer. The signal layer has one or more second signal lines for which the power/ground layer has a power or ground reference plane configured to provide an electrical reference. There may be via(s) connecting semiconductor memory device(s) to third signal line(s) in the inner layer.

In some embodiments a circuit board can include a data area having a power/ground plane disposed in the intermediate layer, a second signal line disposed in the inner layer, a via connecting the outer layer to the inner layer, and a signal layer disposed below the inner layer. The signal layer includes a third signal line. A via may connect the second signal line disposed in the inner layer to the semiconductor memory device. The power/ground plane disposed in the intermediate layer may provide an electrical reference for the second signal line disposed in the lower layer.

In variations of some embodiments described above, a circuit board may further include a signal layer disposed below the inner layer, a second inner layer disposed below the signal layer, a second intermediate layer disposed below the second inner layer, and a second outer layer disposed below the second intermediate layer. A second semiconductor memory device may be coupled to the printed circuit board below the second outer layer. The second outer layer can include a second signal line electrically connected to the second semiconductor memory device. The second inner layer can include a second reference conductive region configured to provide an electrical reference for the second signal line. The second intermediate layer can include second intermediate conductive regions.

In still other variations of embodiments described above, a memory module may include a signal layer disposed between the inner layer and the second inner layer. The signal layer includes a third signal line, and there is a via connecting the first signal line to the third signal line, and a second via connecting the second signal line to the first signal line.

According to other aspects of the inventions, embodiments of a printed circuit board, include a first layer including a first signal line, a second layer disposed below the first layer, the second layer including a power or ground plane, a third layer disposed below the first layer, the third layer including a second signal line and a partial plane, a fourth layer disposed below the third layer, the fourth layer including a third signal line, and a via connecting the first layer to the third signal line disposed in the fourth layer. The partial plane disposed in the third layer is configured to provide an electrical reference for the first signal line disposed in the first layer. In variations the second layer does not include any conductive regions directly below the first signal line, and the second layer may comprise a slit disposed directly below the first signal line. In yet still other embodiments a printed circuit board includes a third signal line disposed in the first layer, and a portion of the power or ground plane is disposed directly below the third signal line.

According to other aspects of the inventions a method of providing a memory module includes providing a semiconductor memory device and providing a circuit board including an outer layer having a first signal line electrically connected to the semiconductor memory device, an inner layer having a reference conductive region configured to provide an electrical reference for the first signal line disposed below the outer layer, and an intermediate layer having conductive regions disposed between the inner and outer layers. Embodiments of such methods may include providing a circuit board having a signal layer with a second signal line disposed below the inner layer and a via connecting the first and second signal lines, and also may include providing a circuit board having a third signal line in the inner layer and a via connecting the third signal line to the memory device.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
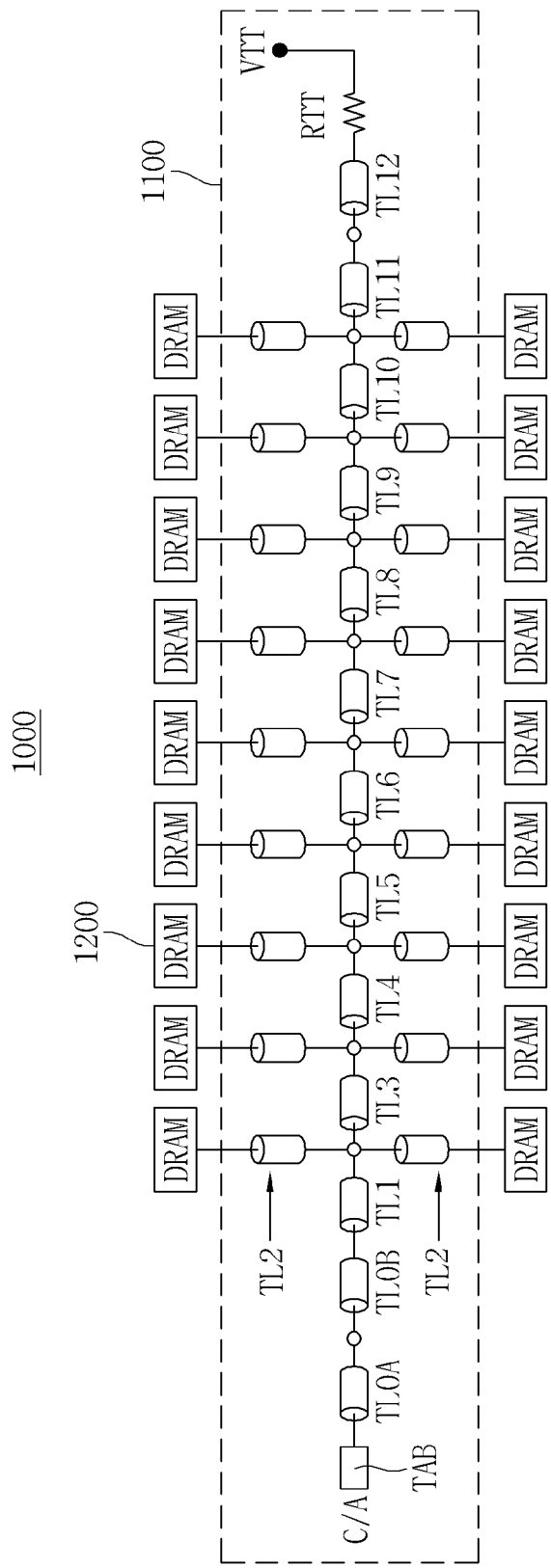
FIG. 1 is a block diagram illustrating a structure of a signal line of a memory module including a printed circuit board according to an embodiment of the inventions.

Example embodiments of the present invention are described below in sufficient detail to enable those of ordinary skill in the art to embody and practice the present invention. It is important to understand that the present invention may be embodied in many alternate forms and should not be construed as limited to the example embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," "above" or "below" versus "directly above" or "directly below", etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1 is a block diagram illustrating a structure of a signal line of a memory module 1000 including a printed circuit board 1100 according to an embodiment of the inventions. In FIG. 1, a transmission line structure of a signal line through which a command/address signal (C/A) is transmitted is illustrated.

Referring to FIG. 1, the memory module 1000 includes a printed circuit board 1100 and dynamic random access memory (DRAM) devices 1200 connected to the circuit board 1100. Signal lines TL0A, TL0B, and TL1~TL12 are between a tab TAB and a termination resistor RTT, and the DRAM devices 1200 are connected to signal lines TL0A, TL0B, TL1, and TL3 TL12 through signal lines TL2. The command/address signal C/A is transmitted to the DRAM devices 1200 through signal lines TL0A, TL0B, TL1, and TL3 TL12 and signal lines TL2.

As described in more detail for embodiments below, the circuit board 1100 may include a region such as plane disposed in a layer that is not directly adjacent to the signal line TL2, which is disposed in the outermost layer, and the plane can be used as an electrical reference for the signal line TL2. Accordingly, an impedance of the signal line TL2 may be increased, and signal integrity of a signal transmitted through the signal line TL2 may be improved.

Although the memory module 1000 shows DRAM devices (which may be any type of DRAM device such as a chip, a package with multiple chips on a substrate, or a package-on-package device, etc.) connected to the circuit board 1100 in FIG. 1, the memory devices included in the memory module 1000 may also be other volatile memory devices such as static random access memory (SRAM), a non-volatile memory such as a flash memory, a phase change memory, a magnetic random access memory (MRAM), and a resistive random access memory RRAM, or combinations of such memory devices.

Figure 2:
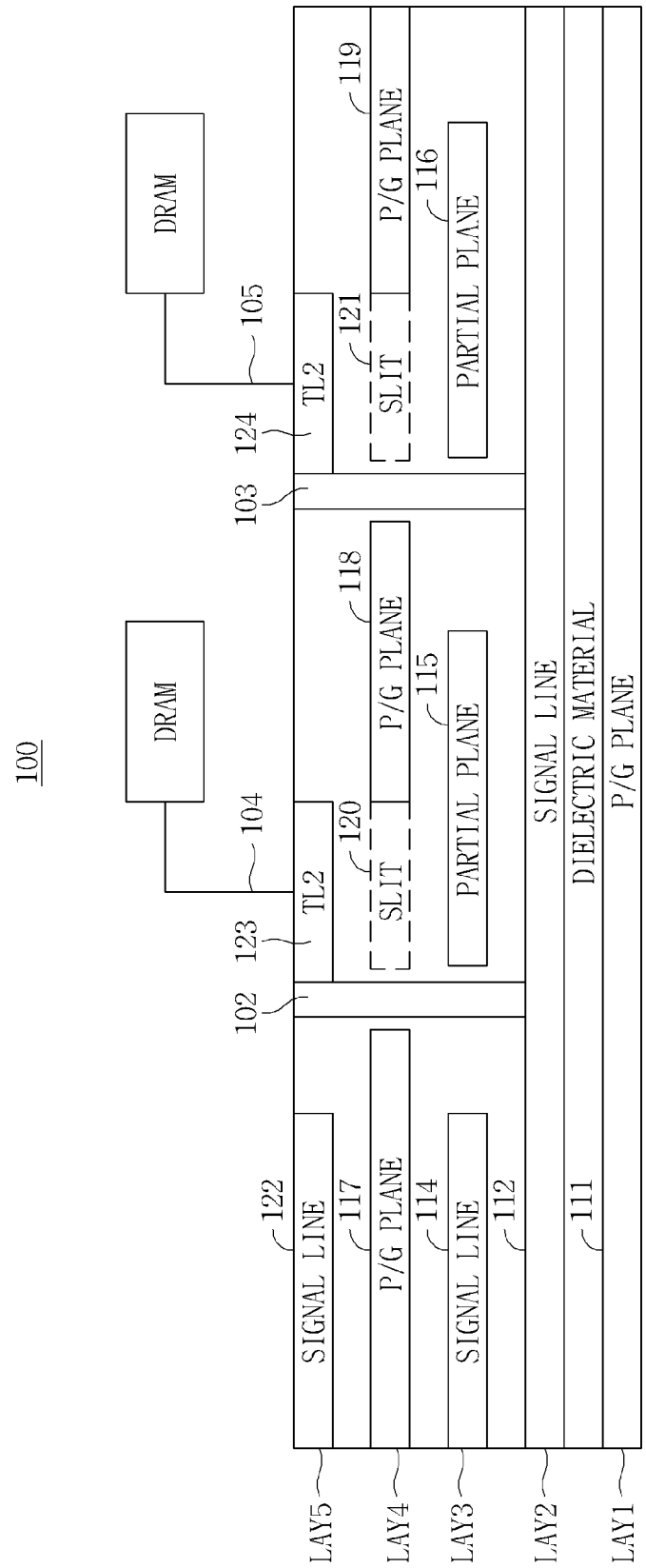
FIG. 2 is a sectional view illustrating one example of a vertical structure of a command/address (C/A) signal area of a printed circuit board according to an embodiment of the inventions.

FIG. 2 is a sectional view illustrating one example of a vertical structure of a command/address (C/A) signal area of a printed circuit board according to an embodiment of the inventions.

Referring to FIG. 2, the command/address (C/A) signal area 100 of the printed circuit board includes a first layer LAY1 in which a power/ground (P/G) plane 111 is disposed, a second layer LAY2 in which a signal line 112 is disposed, a third layer LAY3 formed over an upper side of the second layer LAY2 and in which a signal line 114 and partial planes 115 and 116 are disposed, a fourth layer LAY4 formed over an upper side of the third layer LAY3 and in which power/ground (P/G) planes 117, 118, and 119 are disposed, a fifth layer LAY5 formed over an upper side of the fourth layer LAY4 and in which signal lines 122, 123, and 124 are disposed, and vias 102 and 103 formed from conductive material that vertically penetrates from the second layer LAY2 to a surface of the printed circuit board through the fifth layer LAY5, which is the outermost layer. The partial planes 115 and 116 disposed in the third layer LAY3 operate as a reference plane with respect to signal lines (TL2) 123 and 124 in the outermost fifth layer LAY5, which are electrically connected to signal lines 112 in the second layer LAY2 through the vias 102 and 103.

The signal lines (TL2) 123 and 124 disposed in the fifth layer LAY5 may be electrically connected to semiconductor memory devices such as DRAM devices, etc. through connections 104 and 105 which may include various connection means such as a bump, a solder ball, or a bonding wire. A dielectric material is disposed between each of the layers of the command/address (C/A) signal area 100 of the printed circuit board 1100.

As shown in the example embodiment of FIG. 2, power/ground (P/G) planes may not be formed in areas of the fourth layer LAY4 that are located underneath lower sides of the signal lines (TL2) 123 and 124 disposed in the fifth layer LAY5. Areas of the fourth layer LAY 4 which are located underneath lower sides of the signal lines (TL2) 123 and 124 disposed in the fifth layer LAY5 may include openings such as slits 120 and 121. The command/address (C/A) signal may be transmitted to the semiconductor memory devices through the signal line 112 and the vias 102 and 103 disposed in the second layer LAY2.

Figure 3:
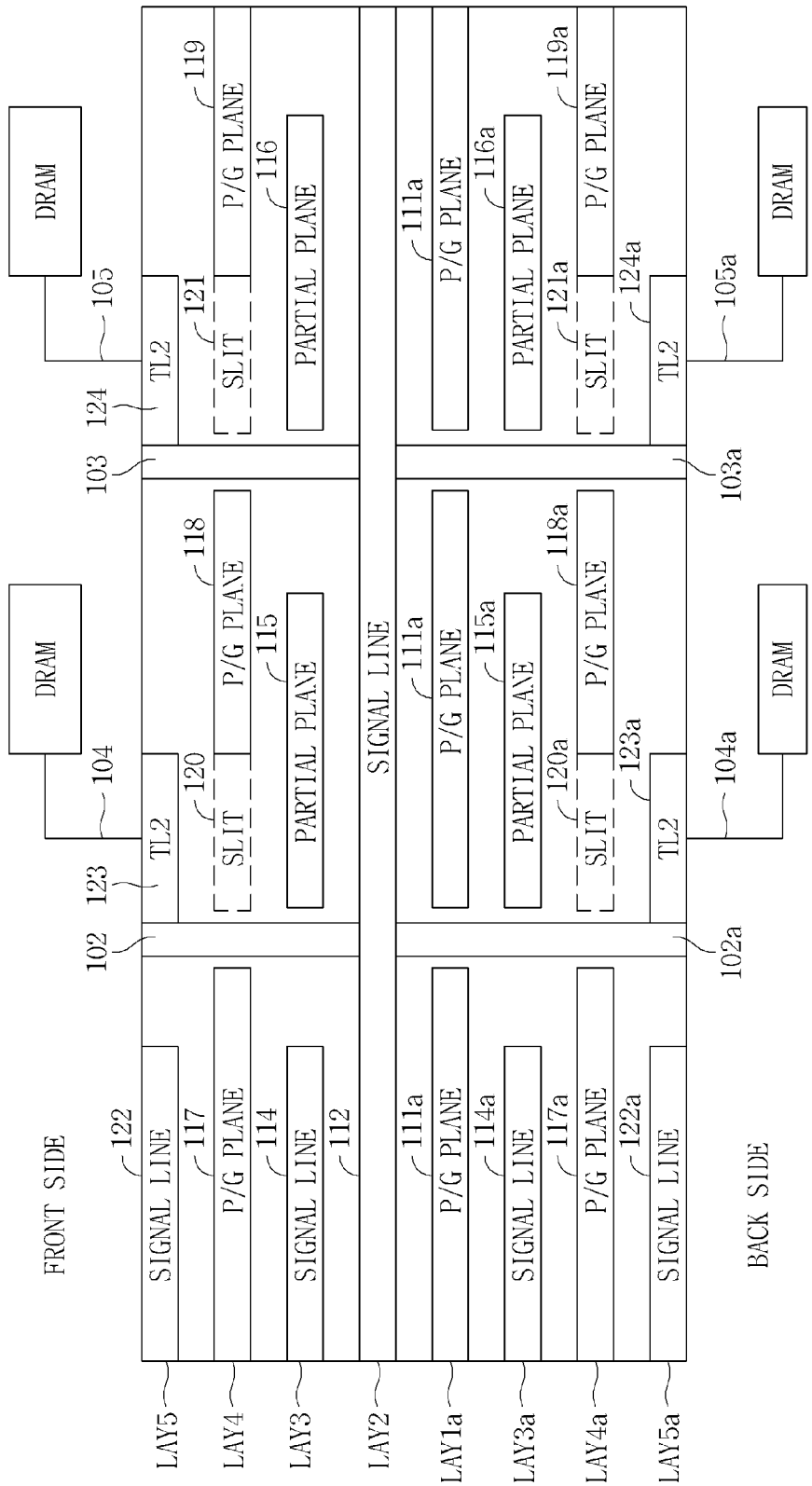
FIG. 3 is a sectional view illustrating another example of a vertical structure of a command/address (C/A) signal area of a printed circuit board according to an embodiment of the inventions.

FIG. 3 is a sectional view illustrating another example of a vertical structure of a command/address (C/A) signal area of a printed circuit board according to an embodiment of the inventions. FIG. 3 illustrates a vertical structure of a circuit board on which memory devices such as DRAM devices are mounted on both a front side (above LAY5) and a back side (below LAY5a).

Referring to the example of FIG. 3, a command/address (C/A) signal area 200 of the circuit board includes a first layer LAY1a in which power/ground (P/G) planes 111a are disposed, a second layer LAY2 in which a signal line 112 is disposed, a third layer LAY3 formed over an upper side of the second layer LAY2 and in which partial planes 115 and 116 are disposed, a fourth layer LAY4 formed over an upper side of the third layer LAY3 and in which power/ground (P/G) planes 117, 118 and 119 are disposed, a fifth layer LAY5 formed over an upper side of the fourth layer LAY4 and in which signal lines 122, 123 and 124 are disposed, and vias 102 and 103 formed by vertically penetrating from the second layer LAY2 to a surface of the front side of the printed circuit board through the outermost fifth layer LAY5. The partial planes 115 and 116 disposed in the third layer LAY3 operate as a reference plane with respect to signal lines (TL2) 123 and 124 in LAY5, which are electrically connected to the signal line 112 in second layer LAY2 by the vias 102 and 103.

In the embodiment of FIG. 3, power/ground (P/G) planes are not formed in areas of the fourth layer LAY4 that are located directly below the signal lines (TL2) 123 and 124 disposed in the fifth layer LAY5. Areas of the fourth layer LAY 4 which are located underneath lower sides of the signal lines (TL2) 123 and 124 disposed in the fifth layer LAY5 may include slits 120 and 121, respectively. The command/address (C/A) signal may be transmitted to the memory devices through the vias 102 and 103 and the signal line 112 disposed in the second layer LAY2.

The signal lines (TL2) 123 and 124 disposed in the fifth layer LAY5 may be electrically connected to semiconductor memory devices such as DRAM devices, etc., respectively, through connections 104 and 105 which may include various connection means such as a bump, a solder ball, or a bonding wire. The connection means 104 and 105 may include a bump, a solder ball, and a bonding wire. A dielectric material is disposed between each of the layers of the command/address (C/A) signal area 200 of the printed circuit board.

Further, the command/address (C/A) signal area 200 of the printed circuit board illustrated in FIG. 3 includes a sixth layer LAY3a formed below a lower side of the first layer LAY1a and in which a signal line 114a and partial planes 115a and 116a are disposed, a seventh layer LAY4a formed below a lower side of the sixth layer LAY3a and in which signal lines 122a, 123a, and 124a are disposed, and an eighth layer LAY5a formed below a lower side of the seventh layer LAY4a and in which signal lines 122a, 123a, and 124a are disposed. Vias 102a and 103a are formed by vertically penetrating from the second layer LAY2 to a surface of a back side of the printed circuit board through the outermost eighth layer LAY5a. The partial planes 115a and 116a disposed in the sixth layer LAY3a may operate as a reference plane with respect to signal lines (TL2) 123 and 124 disposed in the eighth layer LAY5a, which signal lines are electrically connected to the signal lines 112 in the second layer LAY2 through the vias 102a and 103a.

Power/ground (P/G) planes 118a and 119a are not formed in areas of the seventh layer LAY4a that are located directly below the signal lines (TL2) 123a and 124a disposed in the eighth layer LAY5a. Areas of the seventh layer LAY 4a which are located underneath lower sides of the signal lines (TL2) 123a and 124a disposed in the eighth layer LAY5a may include slits 120a and 121a, respectively. The command/address (C/A) signal may be transmitted to the semiconductor memory devices such as DRAM devices, etc. through the signal line 112 and the vias 102a and 103a disposed in the second layer LAY2.

The signal lines (TL2) 123a and 124a disposed in the eighth layer LAY5a are electrically connected to semiconductor memory devices such as DRAM devices, etc. through connection means 104a and 105a which may include a bump, a solder ball, a bonding wire, etc. A dielectric material is disposed between each of the layers of the command/address (C/A) signal area 200 of the printed circuit board.

Figure 4:
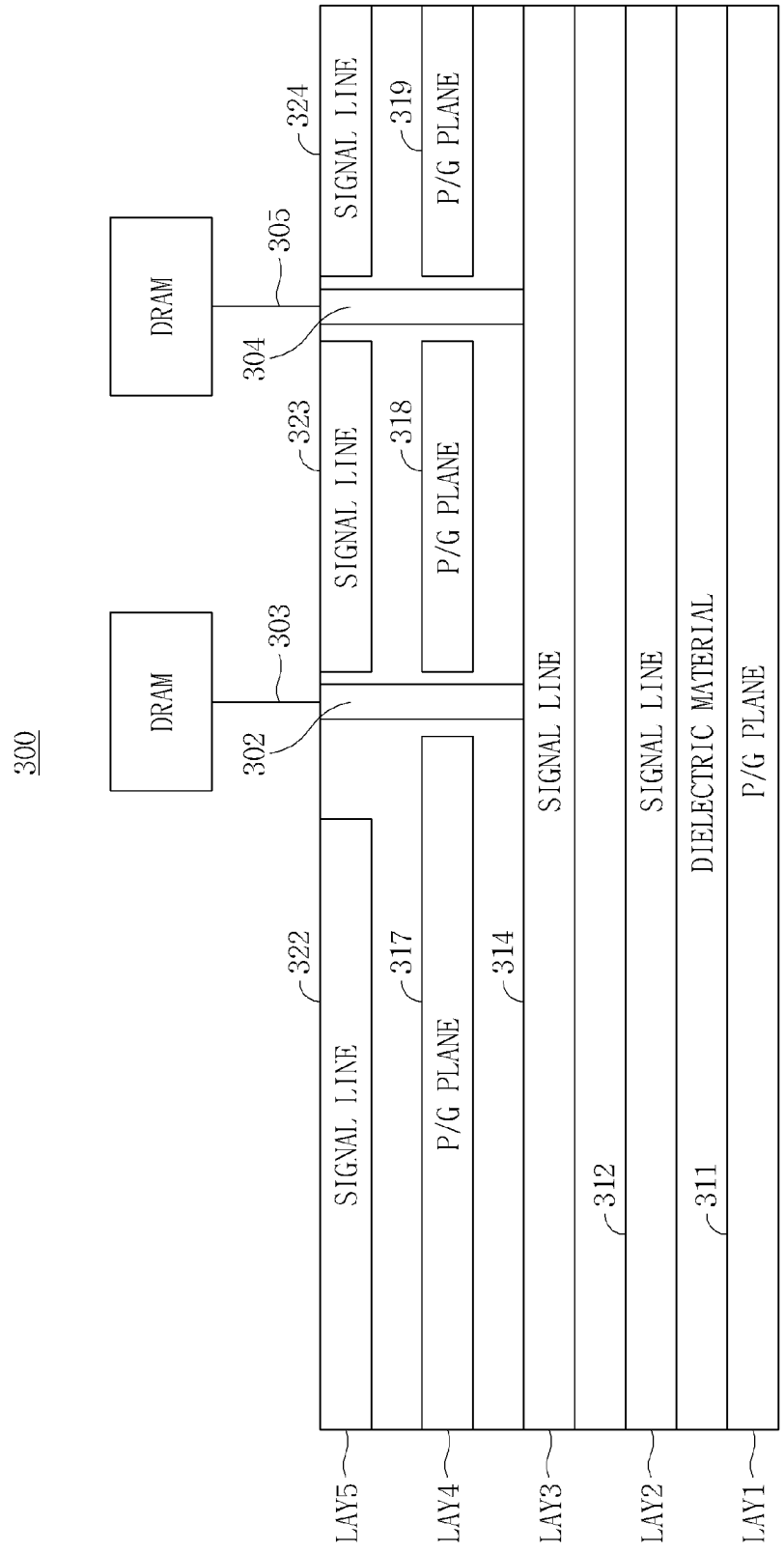
FIG. 4 is a sectional view illustrating one example of a vertical structure of a data (DQ) area of a printed circuit board according to an embodiment of the inventions.

FIG. 4 is a sectional view illustrating one example of a vertical structure of a data (DQ) area of a circuit board according to an embodiment of the inventions. Referring to FIG. 4, a data (DQ) area 300 of a printed circuit board includes a first layer LAY1 in which a power/ground (P/G) plane 311 is disposed, a second layer LAY2 in which a signal line 312 is disposed, a third layer LAY3 formed above an upper side of the second layer LAY2 and in which signal lines 314 are disposed, a fourth layer LAY4 formed above an upper side of the third layer LAY3 and in which power/ground (P/G) planes 317, 318 and 319 are disposed, a fifth layer LAY5 formed over an upper side of the fourth layer LAY4 and in which signals 322, 323 and 324 are disposed, and vias 302 and 304 formed by vertically penetrating from the third layer LAY3 to a surface of the printed circuit board through the outermost fifth layer LAY5.

A signal line 314 disposed in the third layer LAY3 may be electrically connected to memory devices such as DRAM devices, etc. through vias 302 and 304 and connection means 303 and 305. The connection means 303 and 305 may include a bump, a solder ball, a bonding wire, etc. A data (DQ) signal may be transmitted to semiconductor memory devices such as DRAM devices, etc. through a signal line 314 disposed in the third layer LAY3 and the vias 302 and 304. A dielectric material is disposed between each of the layers of the data (DQ) area 300 of the printed circuit board.

Figure 5:
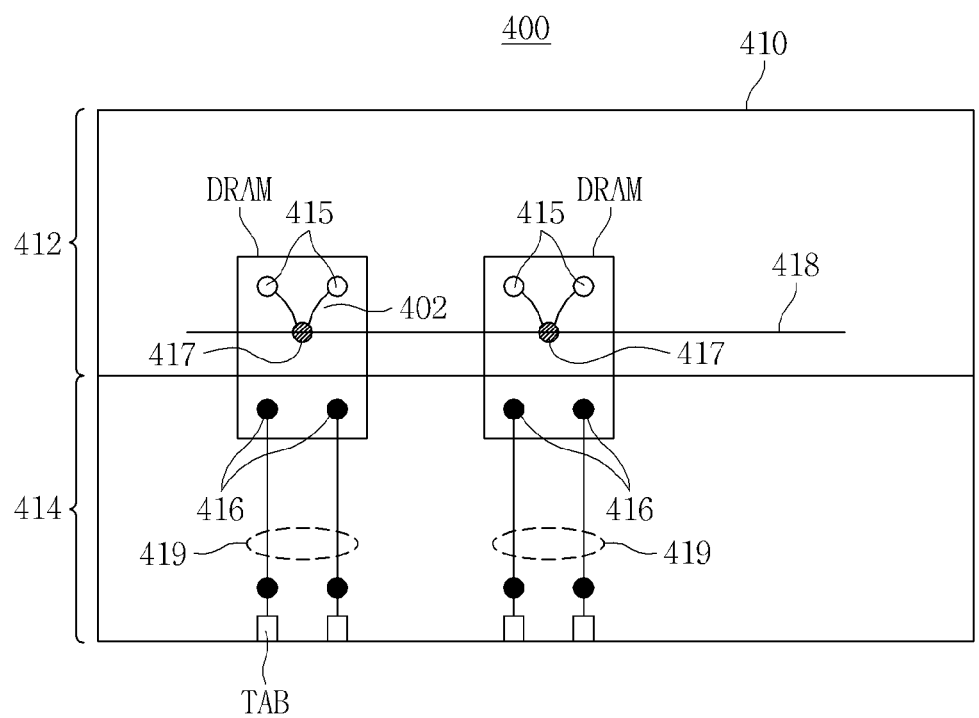
FIG. 5 is a plan view illustrating exemplary aspects of a horizontal structure of a printed circuit board according to an embodiment of the inventions.

FIG. 5 is a plan view illustrating one example of a horizontal structure of a printed circuit board according to an embodiment of the inventions. Referring to FIG. 5, a printed circuit board 400 includes a command/address (C/A) signal area 412 and a data (DQ) area 414. The command/address (C/A) signal area 412 may have a different vertical structure from the data (DQ) area 414. Exemplary vertical structures of the command/address (C/A) signal area 412 are illustrated in FIG. 2 and FIG. 3, and a vertical structure of the data (DQ) area 414 example is illustrated in FIG. 4. A signal line 418 through which the command/address (C/A) signal is transmitted may correspond to the signal line 112 of the second layer LAY2 of FIGS. 2 and 3, and vias 417 may correspond to the vias 102 and 103. The vias 102 and 103 are connected to pads 415 of DRAM devices through signal lines 402 disposed in the outermost layer 410. The signal lines 402 may correspond to the signal lines 123 and 124 located on the fifth layer LAY5 of FIGS. 2 and 3. The command/address (C/A) signal is transmitted to the pads 415 of the DRAM devices through the signal line 418 and the vias 417.

Data (DQ) signals may be communicated with an external device through a tap TAB disposed in the periphery 410 of the PCB 400. Accordingly, there are not the signal lines 418 transmitting the command/address (C/A) signal in the fifth layer LAY5 of the data (DQ) area 414. The signal lines which are located between the pads 416 of the DRAM devices and the tap TAB may be disposed in the third layer LAY3. The signal lines 419 in FIG. 5 can correspond to the signal line(s) 114 located on the third layer LAY3 of FIG. 3.

Figure 6:
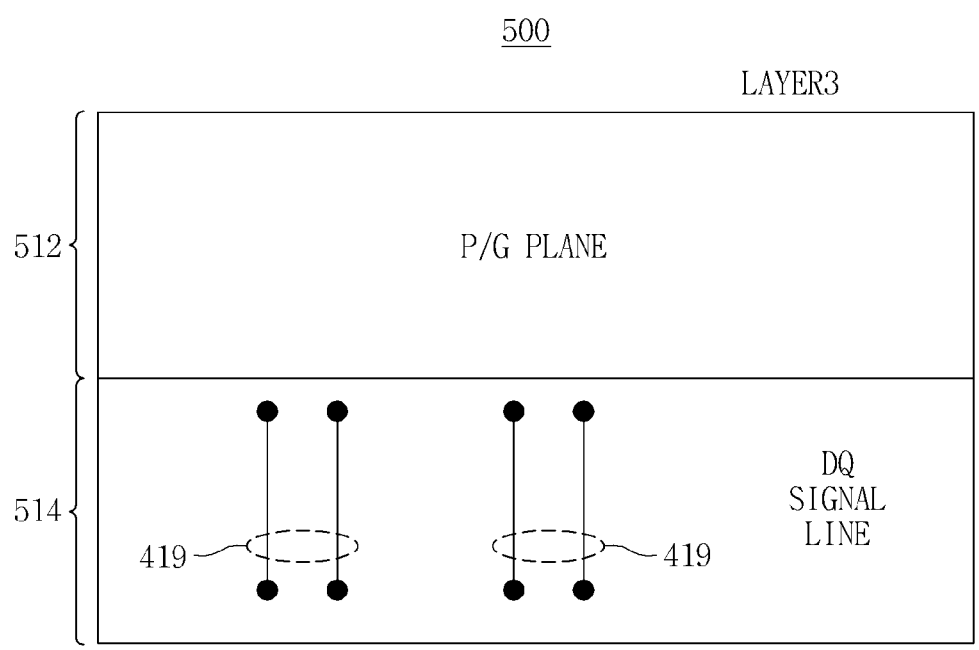
FIG. 6 is a plan view illustrating an example of a horizontal structure of a third layer of a printed circuit board according to an embodiment of the inventions.

FIG. 6 is a plan view illustrating an example of a horizontal structure of a third layer of a printed circuit board according to an embodiment of the inventions. Referring to FIG. 6, the third layer LAY3 of the printed circuit board may include a command/address (C/A) area 512 and a data (DQ) area 514. Power/ground (P/G) planes may be disposed in the command/address (C/A) area 512 of the third layer LAYER3 of the printed circuit board, and signal lines 419 may be disposed in the data (DQ) area 514 of the third layer LAYER3 of the printed circuit board.

Referring to the examples of FIG. 2 to FIG. 6, the printed circuit boards 100, 200, 300, 400 and 500 may be electrically connected to semiconductor memory devices, and a plane disposed in a layer which is not adjacent to the outermost layer containing signal lines TL2 may be used as an electrical reference for the signal lines TL2. Accordingly, a capacitance between the signal line TL2 and the reference plane may be decreased and an impedance of the signal line TL2 may be increased. Therefore, signal integrity of a signal transmitted through the signal line may be improved.

Figure 7:
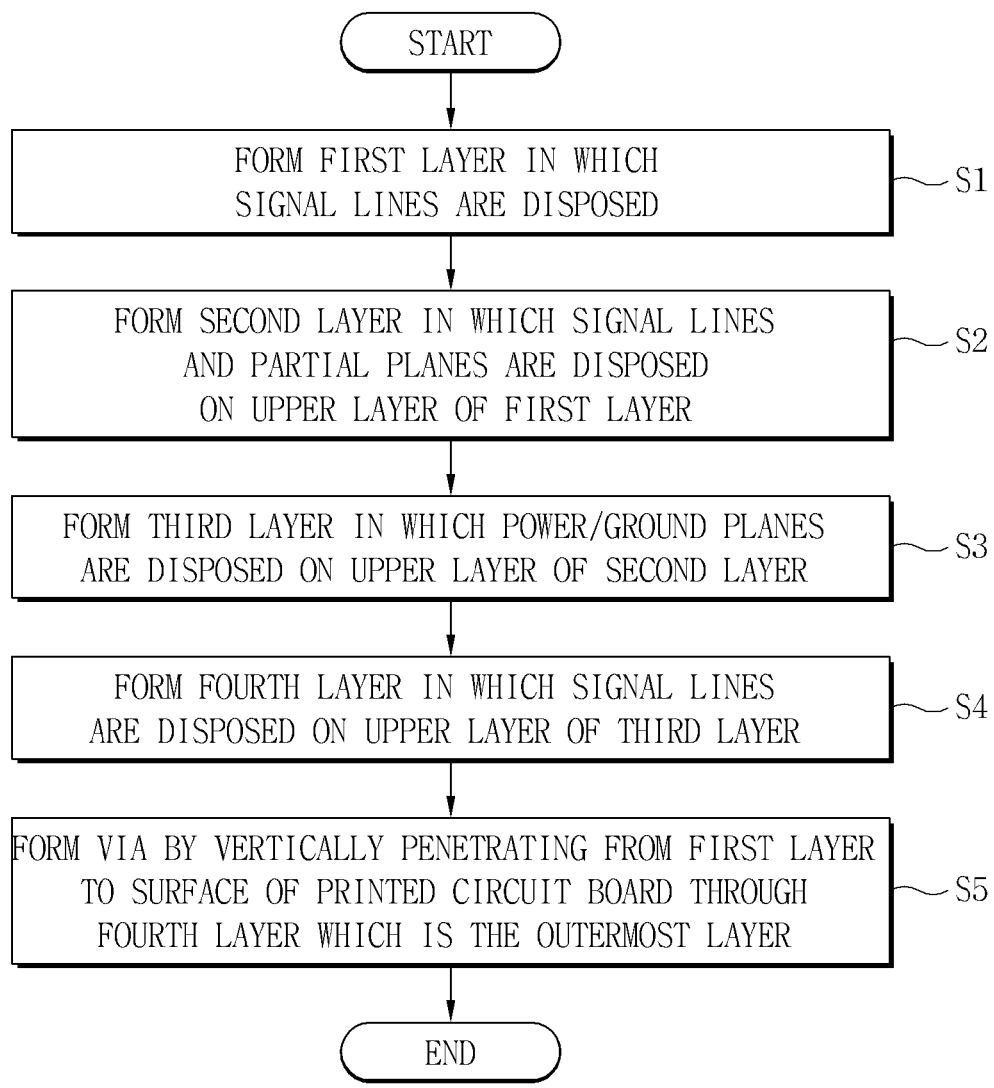
FIG. 7 is a flowchart illustrating a method of forming a command/address (C/A) signal area of a printed circuit board according to an embodiment of the inventions.

FIG. 7 is a flowchart illustrating a method of forming a command/address (C/A) signal area of a printed circuit board according to an embodiment of the inventions. Referring to FIG. 7, a method of forming a command/address (C/A) signal area of the printed circuit board may include following operations.

1) Forming a first layer in which signal lines are disposed (S1).

2) Forming a second layer in which signal lines and partial planes are disposed above an upper side of the first layer (S2).

3) Forming a third layer in which power/ground planes are disposed over an upper side of the second layer (S3).

4) Forming a fourth layer in which signal lines are disposed above an upper side of the third layer (S4).

5) Forming vias by vertically penetrating from the first layer to a surface of the printed circuit board through the outermost fourth layer (S5).

The method of forming a command/address (C/A) signal area of the printed circuit board as shown in FIG. 7 may further include forming a layer including a power/ground plane operating as a reference plane of the signal lines disposed in the first layer under a lower side of the first layer.

Figure 8:
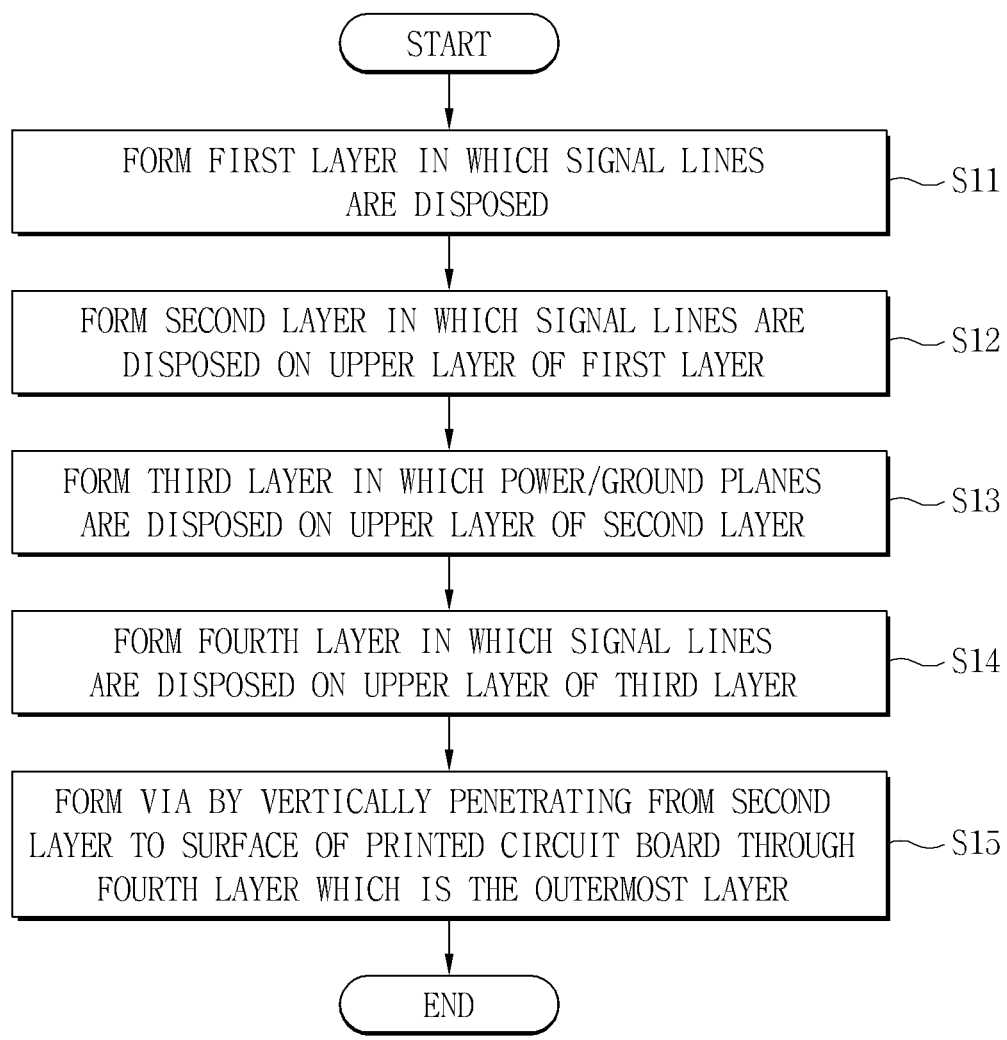
FIG. 8 is a flowchart illustrating a method of forming a data (DQ) area of a printed circuit board according to an embodiment of the inventions.

FIG. 8 is a flowchart illustrating a method of forming a data (DQ) area of a printed circuit board according to an embodiment of the inventive concept. Referring to FIG. 8, a method of forming a data (DQ) area of the printed circuit board may include following operations.

1) Forming a first layer in which signal lines are disposed (S11).

2) Forming a second layer in which signal lines are disposed over an upper side of the first layer (S12).

3) Forming a third layer in which power/ground planes are disposed above an upper side of the second layer (S13).

4) Forming a fourth layer in which signal lines are disposed over an upper side of the third layer (S14).

5) Forming vias by vertically penetrating from the second layer to a surface of the printed circuit board through the outermost fourth layer (S15).

The method of forming a data (DQ) area of the printed circuit board as shown in FIG. 8 may further include forming a layer including a power/ground plane operating as a reference plane of the signal lines disposed in the first layer below a lower side of the first layer.

Figure 9:
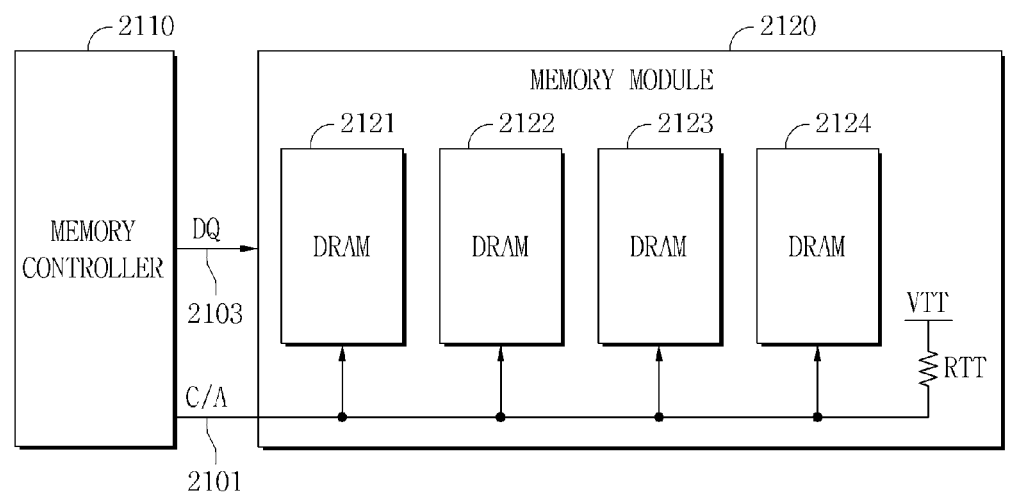
FIG. 9 to FIG. 11 are block diagrams illustrating examples of a memory system including a printed circuit board according to embodiments of the inventions.
Figure 10:
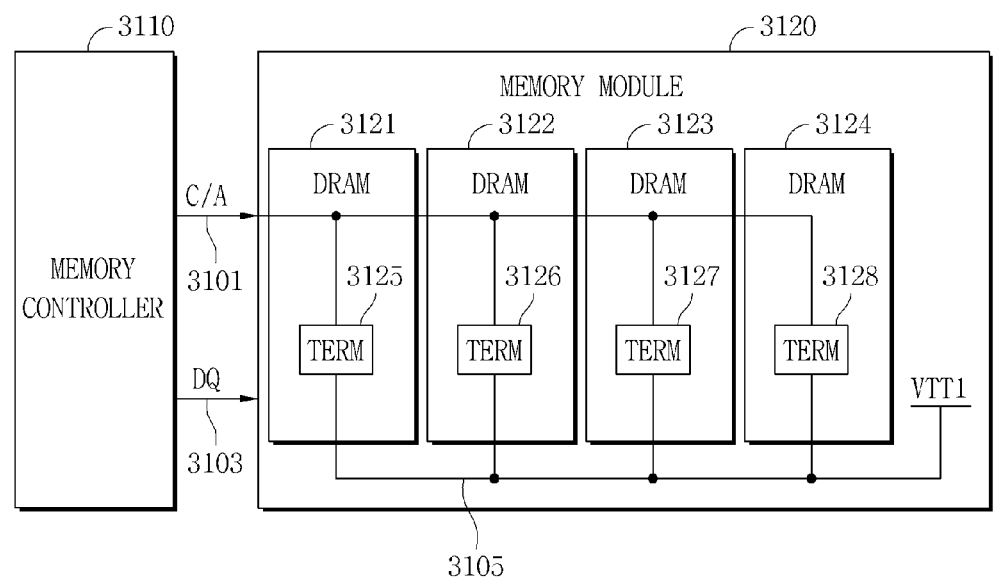
Figure 11:
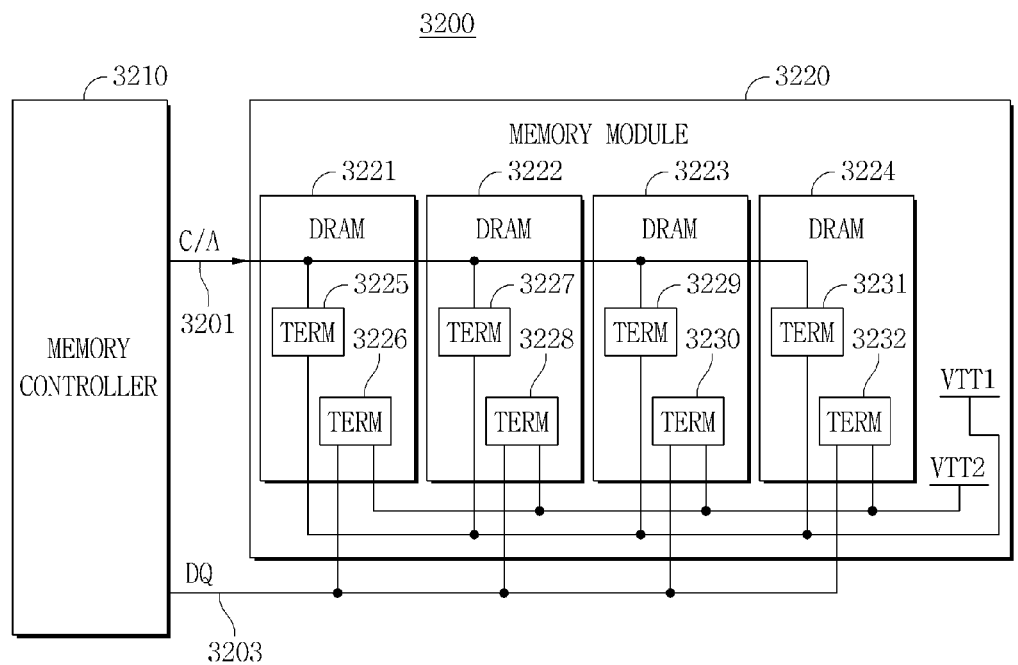

FIG. 9 to FIG. 11 are block diagrams illustrating examples of a memory system including a printed circuit board according to embodiments of the inventive concept.

Referring to FIG. 9, a memory system 2100 may include a memory controller 2110 and a memory module 2120.

The memory controller 2110 may generate a command/address signal (C/A) and a data signal (DQ). A memory module 2120 operates in response to the C/A and DQ signals. A termination resistor RTT for a command/address bus 2101 through which the C/A signal is transmitted and a plurality of semiconductor memory devices 2121, 2122, 2123 and 2124 are mounted on a surface of the memory module 2120. The C/A signal may be packet data in that a command signal and an address signal are coupled in a packet format.

While the memory module 2120 including four semiconductor memory devices is illustrated in FIG. 9, the memory module 2120 may include any practical number semiconductor memory devices. Further, the semiconductor memory devices may be mounted on both sides of the memory module 2120, for example using a PCB that incorporates the embodiment of FIG. 3.

The data signal (DQ) may be transmitted and received between the memory controller 2110 and the semiconductor memory devices 2121, 2122, 2123 and 2124 included in the memory module 2120 through a data bus 2103.

The command/address bus 2101 may use a fly-by topology for the electrical connections with the semiconductor memory devices 2121, 2122, 2123 and 2124. Further, the termination resistor RTT mounted on a substrate of the memory module 2120 may be coupled between the command/address bus 2101 and a termination supply voltage VTT.

Referring to FIG. 10, a memory system 3100 may include a memory controller 3110 and a memory module 3120.

The memory controller 3110 may generate a command/address signal (C/A) and a data signal (DQ). A memory module 3120 operates in response to the C/A and DQ signals. A plurality of semiconductor memory devices 3121, 3122, 3123 and 3124 including termination circuits 3125, 3126, 3127 and 3128 for a command/address bus 3101 through which the C/A signal is transmitted are mounted on a surface of the memory module 3120. The C/A signal may be packet data in that a command signal and an address signal are coupled in a packet format.

While the memory module 3120 including four semiconductor memory devices is illustrated in FIG. 10, the memory module 3120 may include any practical number of semiconductor memory devices. Further, the semiconductor memory devices may be mounted on both sides of the memory module 3120. Memory module 3120 may implement various aspects of embodiments as discussed above for FIGS. 2-4.

The DQ signal may be transmitted and received between the memory controller 3110 and the semiconductor memory devices 3121, 3122, 3123 and 3124 included in the memory module 3120 through a data bus 3103.

The command/address bus 3101 may have a fly-by topology for electrically connecting to the semiconductor memory devices 3121, 3122, 3123 and 3124. Further, respective termination circuits 3125, 3126, 3127 and 3128 included in respective semiconductor memory devices 3121, 3122, 3123 and 3124 may be coupled between the command/address bus 3101 and a termination supply voltage VTT1, and vary a termination resistance of the command/address bus 3101.

Referring to FIG. 11, a memory system 3200 may include a memory controller 3210 and a memory module 3220.

The memory controller 3210 may generate a command/address signal (C/A) and a data signal (DQ). A memory module 3220 may operate in response to the command/address signal (C/A) and the data signal (DQ). A plurality of semiconductor memory devices 3221, 3222, 3223 and 3224 including termination circuits 3225, 3227, 3229 and 3231 for a command/address bus 3201 through which the C/A signal is transmitted are mounted on the surface of the memory module 3220. The C/A signal may be packet data in that a command signal and an address signal are combined in a packet format. Further, the semiconductor memory devices 3221, 3222, 3223 and 3224 may include the termination circuits 3226, 3228, 3230 and 3232 to which the DQ signal is transmitted.

While the memory module 3220 including four semiconductor memory devices is illustrated in FIG. 11, the memory module 3220 may include any practicable number of semiconductor memory devices. Further, the semiconductor memory devices may be mounted on both sides of the memory module 3220. Memory module 3220 may incorporate various aspects of the embodiments of FIGS. 2-4 discussed above.

The DQ signal may be transmitted between the memory controller 3210 and the semiconductor memory devices 3221, 3222, 3223 and 3224 included in the memory module 3220 through a data bus 3203.

The command/address bus 3201 may have a fly-by topology for electrically connecting to the semiconductor memory devices 3221, 3222, 3223 and 3224. Further, respective termination circuits 3225, 3227, 3229 and 3231 included in respective semiconductor memory devices 3221, 3222, 3223 and 3224 may be coupled between the command/address bus 3201 and a first termination supply voltage VTT1, and vary a termination resistance of the command/address bus 3201. The respective termination circuits 3226, 3228, 3230 and 3232 included in the respective semiconductor memory devices 3221, 3222, 3223 and 3224 may be coupled between the data bus 3203 and a second termination supply voltage VTT2, and vary a termination resistance of the data bus 3203.

The first termination supply voltage VTT1 may be provided to the termination circuits 3225, 3227, 3229 and 3231, and the second termination supply voltage VTT2 may be provided to the termination circuits 3226, 3228, 3230 and 3232.

Substrates of the memory modules 2120, 3120 and 3220 as shown in FIG. 9 to FIG. 11 may include printed circuit boards according to embodiments of the inventive concept. Accordingly, the substrates of the memory modules 2120, 3120 and 3220 may be electrically connected to semiconductor memory devices, a plane disposed in a layer which is not directly adjacent to the signal line disposed in the outermost layer may be used as a reference plane of the signal line. Accordingly, an impedance of the signal line may be increased. Therefore, signal integrity of a signal transmitted through the signal line may be improved.

Figure 12:
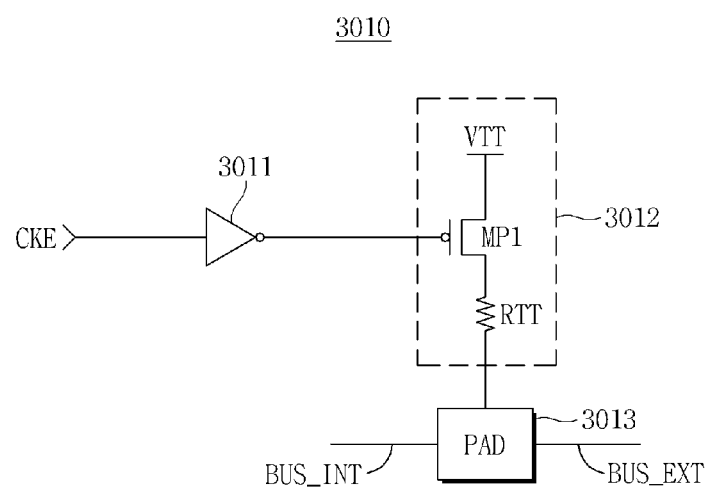
FIG. 12 and FIG. 13 are circuit diagrams illustrating examples of an on-die termination circuit included in the memory systems of FIG. 9 to FIG. 11.
Figure 13:
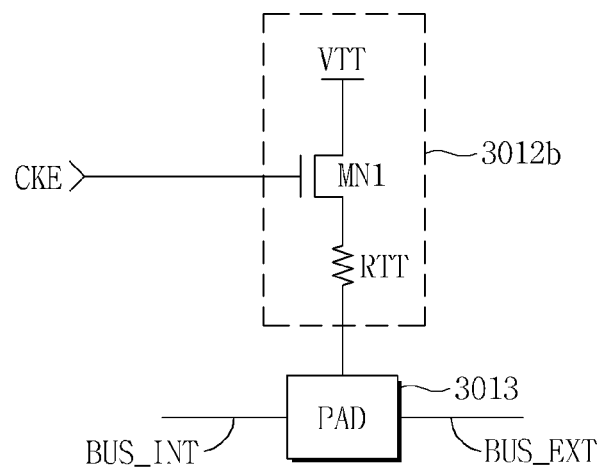

FIG. 12 and FIG. 13 are circuit diagrams illustrating examples of an on-die termination circuit that may be included in the memory systems of FIG. 9 to FIG. 11.

Referring to FIG. 12, an on-die termination circuit 3010 includes an inverter 3011, an on-die termination portion 3012, and an output pad 3013.

The inverter 3011 may invert a phase of a clock enable signal CKE. The on-die termination portion 3012 may be connected to an output pad 3013, and activated or deactivated in response to an output signal.

An external bus BUS_EXT and an internal bus BUS_INT are electrically connected to the output pad 3013. The external bus BUS_EXT may be a command/address (C/A) bus or a data (DQ) bus.

The on-die termination portion 3012 includes a PMOS transistor MP1 and the termination resistor RTT. The PMOS transistor MP1 performs an on/off operation in response to an output signal of the inverter 3011, and the termination resistor RTT is connected between a drain of the PMOS transistor MP1 and the pad 3013. A termination supply voltage VTT is applied to the source of the PMOS transistor MP1.

The on-die termination portion 3010 compensates for the impedance of the data bus of the memory system including semiconductor memory devices. Further, the on-die termination portion 3010 compensates for an impedance of the command/address bus of the memory system including the semiconductor memory devices.

Referring to FIG. 13, the on-die termination circuit 3020 includes an on-die termination portion 3012b and the output pad 3013. The on-die termination portion 3012b is electrically connected to the output pad 3013, and activated or deactivated in response to the clock enable signal CKE.

An external bus BUS_EXT and an internal bus BUS_INT are electrically connected to the output pad 3013. The external bus BUS_EXT may be a command/address (C/A) bus or a data (DQ) bus.

The on-die termination portion 3012b includes an NMOS transistor MN1 and the termination resistor RTT. The NMOS transistor MN1 performs an on/off operation in response to the clock enable signal CKE, and the termination resistor RTT is connected between the source of the NMOS transistor MN1 and the pad 3013. The termination supply voltage VTT is applied to a drain of the NMOS transistor MN1.

Figure 14:
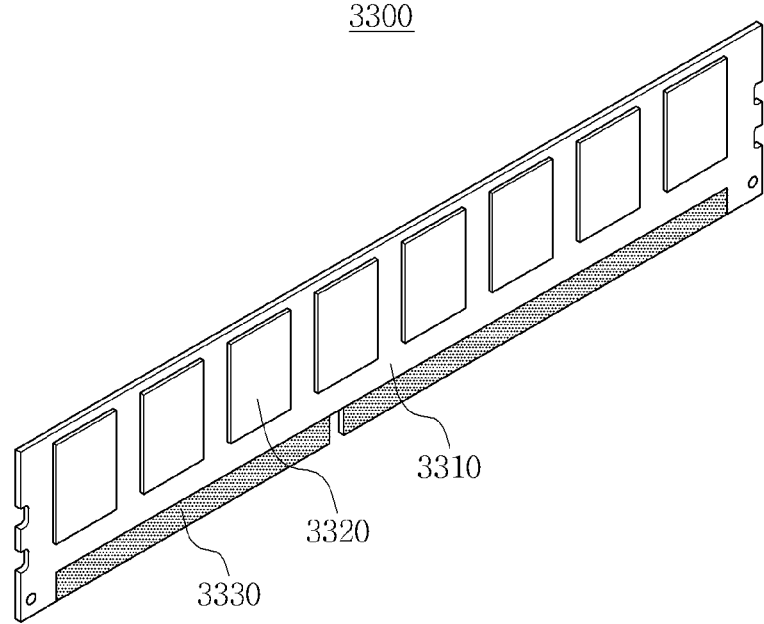
FIG. 14 to FIG. 16 are perspective views of memory modules including printed circuit boards according to embodiments of the inventions.
Figure 15:
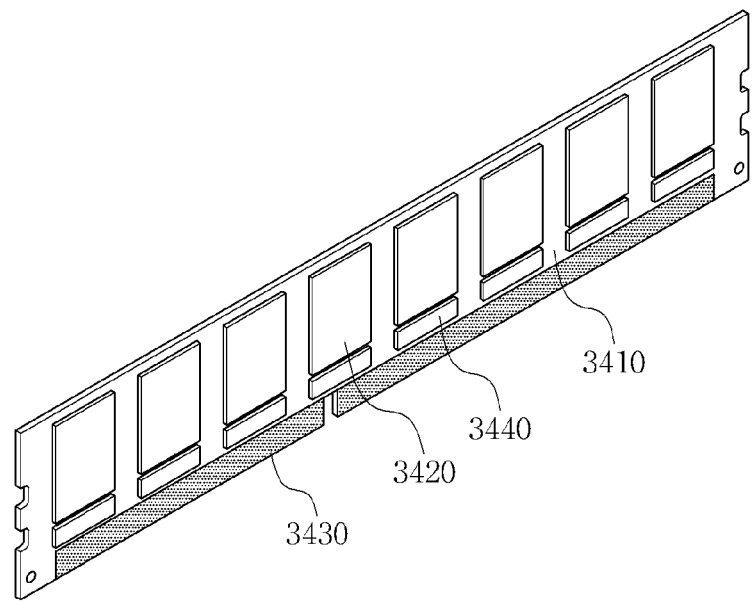
Figure 16:
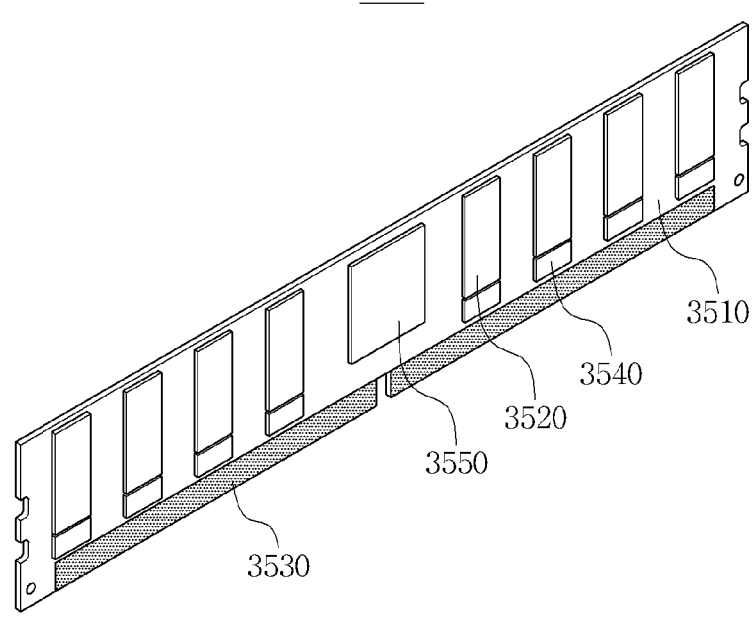

FIG. 14 to FIG. 16 are perspective views of memory modules including printed circuit boards according to embodiments of the inventions.

Referring to FIG. 14, the memory module 3300 includes a printed circuit board 3310, a plurality of semiconductor memory devices 3320, and a connector 3330. The plurality of semiconductor memory devices 3320 may be mounted on both an upper side and a lower side of the printed circuit board 3310. The connector 3330 may be electrically connected to the plurality of semiconductor memory devices 3320 through conductive lines (not shown). Further, the connector 3330 may be connected to a slot of an external host.

Referring to FIG. 15, the memory module 3400 includes a printed circuit board 3410, a plurality of semiconductor memory devices 3420, a connector 3430, and a plurality of buffers 3440. The respective plurality of buffers 3440 are disposed between the respective semiconductor memory devices 3420 and the connector 3430.

The plurality of semiconductor memory devices 3420 and the plurality of buffers 3440 may be mounted on both an upper side and a lower side of the printed circuit board 3410. The plurality of semiconductor memory devices 3420 and the plurality of buffers 3440 mounted on the upper side and the lower side of the printed circuit board 3410 may be connected through a plurality of via holes.

Referring to FIG. 16, a memory module 3500 includes a printed circuit board 3510, a plurality of semiconductor memory devices 3520, a connector 3530, a plurality of buffers 3540, and a controller 3550.

The plurality of semiconductor memory devices 3520 and the plurality of buffers 3540 are mounted on both an upper side and a lower side of the printed circuit board 3510. The plurality of semiconductor memory devices 3520 and the plurality of buffers 3540 mounted on the upper side and the lower side of the printed circuit board 3510 may be connected through a plurality of via holes.

The substrate of the memory modules 3300, 3400 and 3500 shown in FIG. 14 to FIG. 16 may include various embodiments of a printed circuit board according the inventions. Accordingly, the substrate of the memory modules 3300, 3400 and 3500 may be electrically connected to semiconductor memory devices, and a plane disposed in a layer that is not directly adjacent to the signal line disposed in the outermost layer may be used as a reference plane of the signal line. Accordingly, an impedance of the signal line may be increased. Therefore, signal integrity of a signal transmitted through the signal line may be improved.

The printed circuit board of embodiments according to the inventions may be electrically connected to the semiconductor memory devices, and use a plane disposed in a layer that is not directly adjacent to a signal line disposed in the outermost layer as the reference plane for the signal line. Accordingly, an impedance of the signal line may be increased. Therefore, signal integrity of a signal transmitted through the signal line may be improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A memory module, comprising:
   a semiconductor memory device; and
   a circuit board coupled to the semiconductor memory device, the circuit board including an outer layer disposed below the semiconductor memory device, an inner layer disposed below the outer layer, and an intermediate layer disposed between the inner and outer layers, wherein
   the outer layer includes a first signal line electrically connected to the semiconductor memory device, the inner layer includes a reference conductive region configured to provide an electrical reference for the first signal line, and the intermediate layer includes intermediate conductive regions.

2. The memory module of claim 1, wherein the circuit board comprises a command/address signal area that includes the first signal line, the reference conductive region, the intermediate conductive regions, and a signal layer disposed below the inner layer, wherein
   the intermediate conductive regions comprise a power/ground plane,
   the signal layer includes a second signal line electrically connected to the outer layer through a via connecting the outer layer to the signal layer, and
   the inner layer includes a third signal line,
   wherein the reference conductive region disposed in the inner layer comprises a conductive plane configured to provide the electrical reference for the first signal line disposed in the outer layer.

3. The memory module of claim 2, wherein there are no conductive regions disposed in the intermediate layer directly below the first signal line disposed in the outer layer.

4. The memory module of claim 2, wherein the second signal line disposed in the signal layer is a command/address signal line electrically connected to the semiconductor memory device.

5. The memory module of claim 1, wherein the intermediate layer comprises a slit disposed directly below the first signal line disposed in the outer layer.

6. The memory module according to claim 1, wherein the circuit board comprises a data area that includes:
   a signal layer disposed below the inner layer, the signal layer having a second signal line,
   a power/ground layer disposed below the signal layer, the power/ground layer having a power/ground reference plane configured to provide an electrical reference for the second signal line,
   a third signal line disposed in the inner layer, and
   a via connecting the third signal line to the semiconductor memory device.

7. The memory module according to claim 6, wherein the power/ground reference plane comprises at least one of a power plane and a ground plane.

8. The memory module according to claim 1, wherein the circuit board comprises a data area that includes:
   a power/ground plane disposed in the intermediate layer,
   a second signal line disposed in the inner layer,
   a via connecting the outer layer to the inner layer, and
   a signal layer disposed below the inner layer, the signal layer including a third signal line.

9. The memory module according to claim 8, wherein the via connecting the outer layer to the inner layer connects the second signal line disposed in the inner layer to the semiconductor memory device.

10. The memory module according to claim 8, wherein the power/ground plane disposed in the intermediate layer is configured to provide an electrical reference for the second signal line disposed in the lower inner layer.

11. The memory module according to claim 8, further comprising a power/ground layer disposed below the signal layer, the power/ground layer including a power plane or a ground plane, and the power or ground plane is configured to provide an electrical reference for the third signal line disposed in the signal layer.

12. The memory module according to claim 1, wherein the circuit board further comprises:
   a signal layer disposed below the inner layer,
   a second inner layer disposed below the signal layer,
   a second intermediate layer disposed below the second inner layer,
   a second outer layer disposed below the second intermediate layer, wherein
   a second semiconductor memory device coupled to the circuit board below the second outer layer, wherein
   the second outer layer includes a second signal line electrically connected to the second semiconductor memory device, the second inner layer includes a second reference conductive region configured to provide an electrical reference for the second signal line, and the second intermediate layer includes second intermediate conductive regions.

13. The memory module according to claim 12, further comprising
   a signal layer disposed between the inner layer and the second inner layer, the signal layer including a third signal line,
   a via connecting the first signal line to the third signal line, and a second via connecting the second signal line to the first signal line.

14. The memory module of claim 1, further comprising a dielectric material disposed between the outer layer and the intermediate layer, and a dielectric material disposed between the intermediate layer and the inner layer.

15. A printed circuit board, comprising:
a first layer including a first signal line;
a second layer disposed below the first layer, the second layer including a power or ground plane;
a third layer disposed below the second layer, the third layer including a second signal line and a partial plane;
a fourth layer disposed below the third layer, the fourth layer including a third signal line; and
a via connecting the first layer to the third signal line disposed in the fourth layer,
wherein the partial plane disposed in the third layer is configured to provide an electrical reference for the first signal line disposed in the first layer.

16. The printed circuit board according to claim 15, wherein the second layer does not include any conductive regions directly below the first signal line.

17. The printed circuit board according to claim 15, wherein the second layer comprises a slit disposed directly below the first signal line.

18. The printed circuit board according to claim 15, further comprising a third signal line disposed in the first layer, and an insulator placed between the first layer and the second layer, wherein a portion of the power or ground plane is disposed directly below the third signal line and the third signal line and the power or ground plane are electrically separated by the insulator.

19. A method of providing a memory module, comprising:
providing a semiconductor memory device; and
providing a circuit board including an outer layer having a first signal line electrically connected to the semiconductor memory device, an inner layer having a reference conductive region configured to provide an electrical reference for the first signal line disposed below the outer layer, and an intermediate layer having conductive regions disposed between the inner and outer layers.

20. The method of claim 19, wherein the step of providing a circuit board further comprises providing a circuit board including a signal layer having a second signal line disposed below the inner layer, and a via connecting the first and second signal lines.

* * * * *